US010521956B2

(12) United States Patent
Drinovsky et al.

(10) Patent No.: US 10,521,956 B2
(45) Date of Patent: Dec. 31, 2019

(54) SIMULATING A GEOLOGICAL REGION WITH MULTIPLE REALIZATIONS

(71) Applicant: Landmark Graphics Corporation, Houston, TX (US)

(72) Inventors: Steven James Drinovsky, Katy, TX (US); Steven Bryan Ward, Austin, TX (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 14/904,706

(22) PCT Filed: Mar. 31, 2015

(86) PCT No.: PCT/US2015/023489
§ 371 (c)(1),
(2) Date: Jan. 13, 2016

(87) PCT Pub. No.: WO2016/159967
PCT Pub. Date: Oct. 6, 2016

(65) Prior Publication Data
US 2017/0228925 A1 Aug. 10, 2017

(51) Int. Cl.
*G06T 17/05* (2011.01)
*G06F 9/455* (2018.01)
*G06F 17/50* (2006.01)
*G06F 8/38* (2018.01)

(52) U.S. Cl.
CPC .............. *G06T 17/05* (2013.01); *G06F 9/455* (2013.01); *G06F 17/5009* (2013.01); *G06F 8/38* (2013.01)

(58) Field of Classification Search
None
See application file for complete search history.

(56) References Cited

U.S. PATENT DOCUMENTS

| 5,905,657 A | 5/1999 | Celniker |
| 7,047,165 B2 * | 5/2006 | Balaven ................. G06T 17/20 703/2 |
| 2002/0038201 A1 | 3/2002 | Balaven et al. |
| 2007/0219724 A1 | 9/2007 | Li et al. |

(Continued)

FOREIGN PATENT DOCUMENTS

| WO | WO-2011/033126 A2 | 3/2011 |
| WO | WO-2012/015518 A2 | 2/2012 |

OTHER PUBLICATIONS

International Search Report and Written Opinion for PCT/US2015/023489 dated Dec. 15, 2015.

*Primary Examiner* — Suzanne Lo

(57) ABSTRACT

A unified geological data representation is generated based on multiple disconnected geological data representations and provided to a computing device. The unified geological data representation is generated based on combining respective grid structures for each disconnected geological data representation. The unified geological data representation is processed by the computing device to generate multiple output collections of geological realization data, each output collection corresponding to a respective one of the disconnected geological data representations. One or more respective virtual models are generated for representation of the generated output collections of geological realization data, and provided for display.

20 Claims, 5 Drawing Sheets

(56) References Cited

U.S. PATENT DOCUMENTS

| | | |
|---|---|---|
| 2011/0054857 A1 | 3/2011 | Moguchaya |
| 2013/0096703 A1* | 4/2013 | Kurtenbach .......... G06F 3/0484 700/90 |
| 2013/0211800 A1* | 8/2013 | Fung .................. G06F 17/5009 703/2 |
| 2014/0236559 A1 | 8/2014 | Fung et al. |

* cited by examiner

SIMULATING A GEOLOGICAL REGION WITH MULTIPLE REALIZATIONS

BACKGROUND

A virtual simulation may be performed based on a model of a geological region to assist in understanding characteristics of the geological area represented by the model. For example, with regard to a well, the virtual simulation may assist a well operator in improving production of fluids from an associated reservoir. The model of the geological region may be constructed of a grid of cells, with each of the cells being associated with one or more geological properties (e.g., porosity, permeability, etc.) that define the formation of geological structures in the region.

In conventional geological modeling, simulations are based on geological data values corresponding to the grid cells in a corresponding geological model. Because of the large number of grid cells in the model, a single simulation may take a significant amount of time and processing power. Moreover, to address uncertainty in interpreting a geological model through a simulation, a stochastic process may be used to produce multiple realizations of the same model, each with different values. Multiple simulations are then produced based on the realizations for evaluation by the operator. However, processing multiple realizations compounds the amount of time and processing power required to produce the simulations.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION

Figure 1:
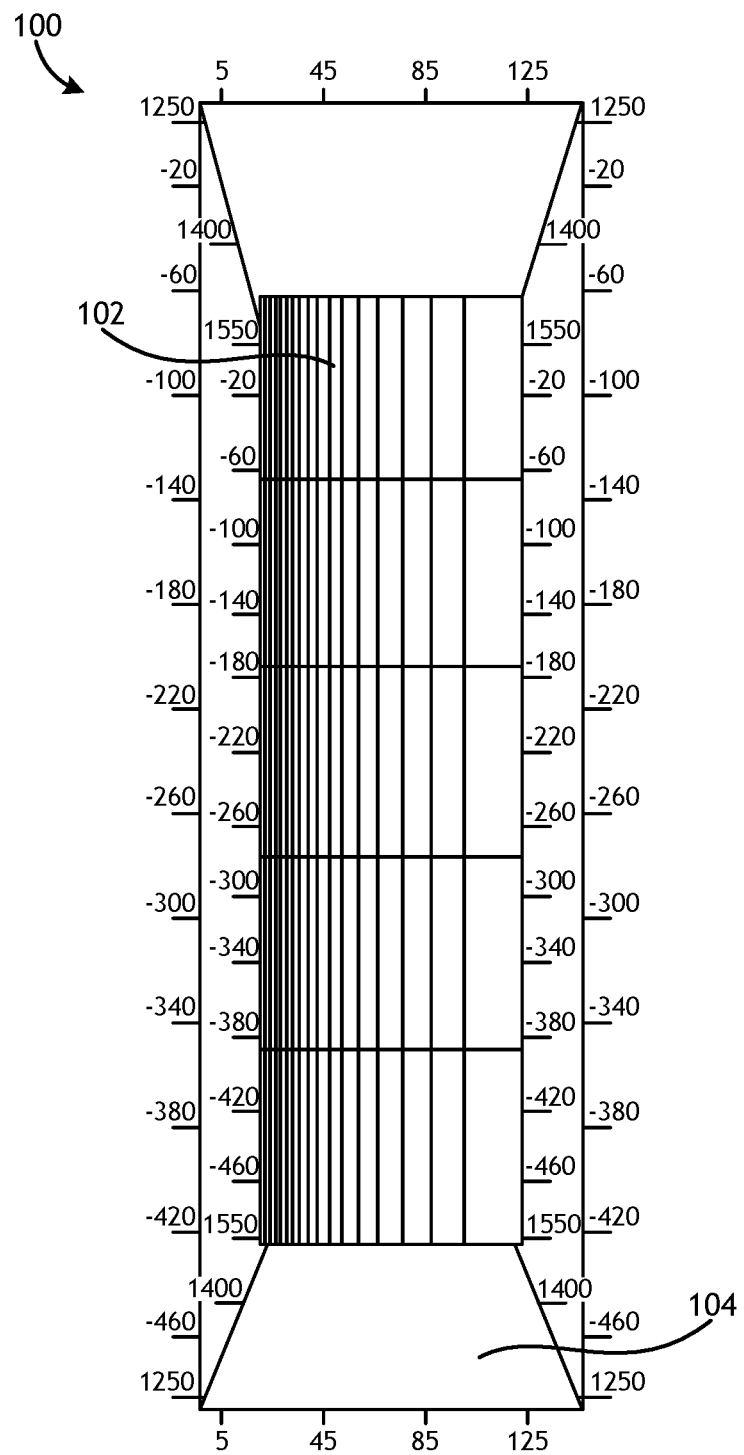
FIG. 1 depicts an example grid cell structure corresponding to example geological realization used for modeling and simulation of a geographical area.

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent that the present disclosure may be practiced without these specific details. In some instances, structures and components are shown in block diagram form in order to avoid obscuring the concepts of the present disclosure. Like components are labeled with identical element numbers for ease of understanding.

The subject technology processes multiple realizations of a model simultaneously to reduce simulation time and processing power. An area of a geological region (e.g., a well) is selected for evaluation, for example, using a stochastic process. In this regard, multiple realizations of the selected geological region are generated. Each realization is a geological data representation of the model, which includes discrete a set of values assigned to various properties (e.g., rock properties). With regard to a stochastic process, each geological data representation may include a different set of values.

According to the subject technology, a unified data representation is generated based on multiple different geological data representations, each geological data representation being for a different realization. Each of the different geological data representations may be of the same portion of the same geological model. In this regard, the geological data values included in each data representation may correspond to the same geological area, but may have different grid topology and/or geological property values as a result of, for example, a stochastic process. In one or more implementations, the unified data representation may be formed by appending the grid cells (and their values) for a first realization with the same grid cells (having different values) for a second realization, and so on (see FIG. 3). In some implementations, the unified data representation may be formed by appending different grid topologies for the same geographical area of interest.

If the unified data interpretation were to be processed conventionally, the processing of each grid cell of the unified data representation may depend on the processing of other cells, including cells of all data representations that make up the unified data interpretation. The subject technology, however, disconnects (e.g., isolates) each of the geological data representations within the unified data representation from each other. In this regard, the grid cells of each data representation that surround an area of interest may be assigned values forming a flow barrier. For example, where each geological data representation in a unified data representation is of the same well, the cells of the grid surrounding the well may include geological data values that represent the flow barrier.

The geological property values may represent porosity or permeability of earth structure and may be set to a null or zero value, signifying that no fluid may flow through these cells. The flow barrier may be, as an example, a single cell closed perimeter around a cell structure that includes the area of interest. In one or more implementations, the cell structure may include local grid refinement (LGR) for an enhanced grid definition, for example, in areas that include wells or other complex geology where increased accuracy may be desired.

A processor configured according to the subject technology receives the unified data representation as input and processes the unified data representation to generate output simulation data, which includes multiple output collections of geological realization data. Each of the generated collections of geological realization data corresponds to a respective one of the geological data representations that make up the inputted unified geological data representation. An identification of a corresponding realization may also be associated with each geological data representation within the unified representation, for example, by assignment of a realization identifier to the data values. The collections are generated by analyzing the grid cells and their corresponding values of the entire unified geological data representation; however, the flow barriers within the unified geological representation cause the processor to compute realization data for each geological data representation within the unified representation without influence from data values outside the representation. Each collection of geological realization data is identified by parsing the simulation data to identify a realization identifier assigned to the grid cells (or values) of each corresponding input geological data representation.

On concluding the processing, multiple respective virtual models are generated and provided for display for each generated collection of geological realization data. The realizations may then be ranked and/or compared to observed data. One or more highest ranked realizations of the simplified reservoir model may then be selected for further use.

FIG. 1 depicts an example grid cell structure 100 corresponding to example geological realization used for modeling and simulation of a geographical area, according to one or more implementations of the subject technology. Each of the grid cells 102 that make up grid cell structure 100 may correspond to a geological property value for a geological area represented by the model. For example, grid cells 102 may be populated with values corresponding to porosity so that a corresponding simulation illustrates the flow of a fluid through the geological area represented by the model. The property values may be petro-physical properties such as porosity, permeability, or total organic carbon. However, the subject technology is not limited to porosity, permeability, or total organic carbon. Any property that may populate cells of the three-dimensional grid matrix 100 may be used.

In one or more implementations, grid cell structure 100 may be a volumetric (three-dimensional) model of realization data. The cells 102 may be arranged such that each cell location is at a coordinate index, for example, in three-dimensional space. Each cell may be indexed by a coordinate system, such as a Euclidean coordinate [i, j, k], that denotes the geometrical location of the cell and the geometrical location of the corresponding property value.

Cell structure 100 may be representative of a geological area, including a well or reservoir, or portion thereof. In the depicted example, cell structure 100 includes, for example, cells 102 (e.g., as an LGR area of cells) providing an enhanced grid definition of the geological area of interest (e.g., a well) and other surrounding cells 104. As will be described further, an area of interest in each realization to be simulated according to the subject technology may be defined by an group of cells surrounded by cells representative of an isolation boundary. According to some implementations, the isolation boundary is a group of cells each having a porosity value of zero. In this regard, the cells cut off the possibility of fluid flow in a simulation rendered from the realization.

Figure 2:
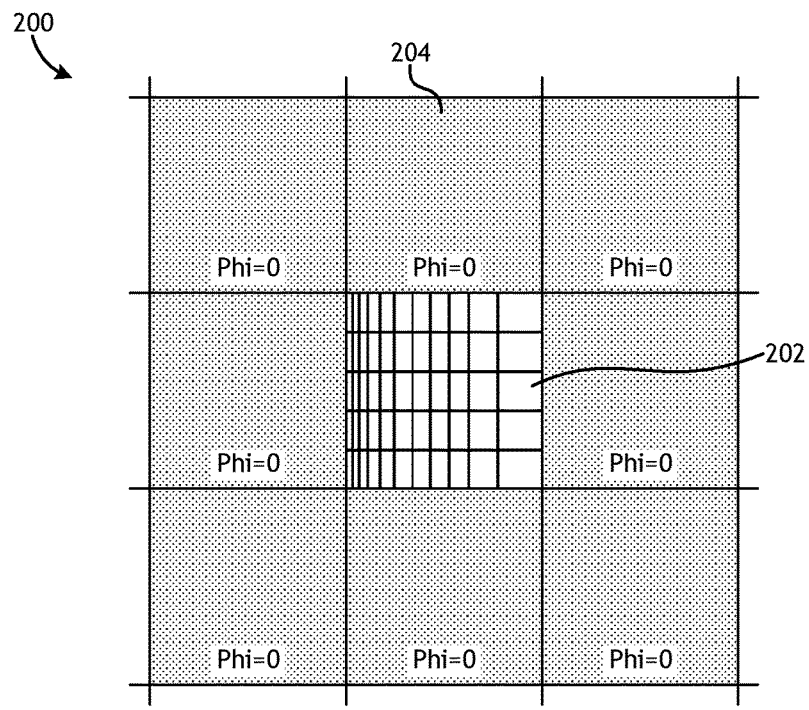
FIG. 2 depicts an example geological data representation including an example flow barrier.

FIG. 2 depicts an example geological data representation 200 including an example flow barrier, according to one or more implementations of the subject technology. Geological data representation may, for example, correspond to grid cell structure 100 or similar grid cell structure. As described previously, multiple geological representations may be created based on different data realizations of the same geological area. The subject technology disconnects (or isolates) each of the data representations from each other. In this regard, geological data representation 200 may include a first group of cells 202 and a second group of cells 204.

The first group of cells 202 may include corresponding property values that provide a characterization of a geological area of interest such as a geological formation capable of producing a fluid resource. The second group of cells 204 may be assigned property values representative of a barrier to a flow of the fluid resource. For example, where geological data representation 200 is of a well, the cells of the grid surrounding the well may include geological data values that represent characteristics of earth structure around the well that is resistant to fluid flow (e.g., a non-porous medium such as rock). In one or more implementations, first group of cells 202 and second group of cells 204 may include different grid characteristics. In the depicted example, first group of cells 202 is an LGR cell structure that has a much larger number of cells than second group of cells 204, which forms a perimeter of a single row of cells. While the graphical layout area of first group of cells 202 is the same of a single cell in second group of cells 204, first group of cells 202 may be representative of a much larger physical geological area of the earth than a cell in second group of cells 204.

In the depicted example, the first group of cells 202 are cells representative of an area of interest which will be isolated by a flow barrier, while the surrounding, second group of darker shaded cells 204 represent the flow barrier. The grid cells of the flow barrier, when simulated do not provide for fluid flow in the simulation. For example, a property value corresponding to fluid flow associated with each cell may be set to a value that indicates a lack of fluid flow (e.g., Phi=0 in the depicted example). When data representation 200 is rendered in a simulation, the selected area will not be influenced by other portions of the representation or overarching model. Accordingly, the first group of cells 202 may be representative of the area selected for simulation, while cells 204 that make up the flow barrier may form a perimeter around the area selected for the simulation.

Geological data representation 200 may be a three-dimensional grid structure, or may be a two-dimensional grid structure. In one or more implementations, data representation 200 is formed by collapsing a three-dimensional geological realization (e.g., a virtual model) into a two-dimensional array according to the realization's geometry and a predetermined algorithm.

In geo-statistical earth modeling (EM), geologists and reservoir engineers may choose to simulate a geological area of interest such as a well using multiple geological data representations. In this regard, geological data representation 200 may be one representation of many such representations. Each representation may carry within itself different property values generated based on a stochastic process. Accordingly, in some implementations, the cells representative of the geological area of interest may take on different property values and/or grid characteristics in each data representation. However, the overall size of the representation and/or the coordinates of the flow barrier; e.g., the darker shaded cells in the depicted example, may remain consistent (although not required) in each representation.

Figure 3:
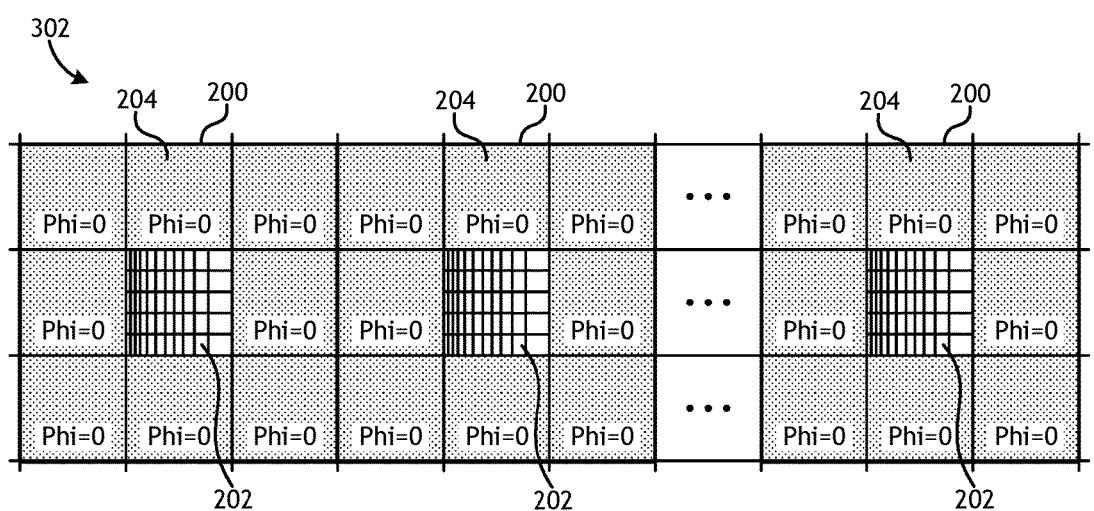
FIG. 3 depicts multiple example disconnected geological data representations combined into an example unified geological data representation.

FIG. 3 depicts multiple example disconnected geological data representations 200 combined into an example unified geological data representation 302, according to one or more implementations of the subject technology. The subject technology may organize the disconnected geological data representations 200 so that each data representation may be generated for the same geological area. However, it is not necessary that each representation be for the same area, as long as each representation combined into unified geological representation remains isolated by way of a corresponding barrier.

In some implementations, the subject technology may reshape geological data representations 200 from a first form to a second form according to a predetermined algorithm, so that each representation is in the second form, and then combine the reshaped representations utilizing their second forms. As depicted by FIG. 3, each geological data representation 200 may make up a grid block, and the combined blocks may make up a template that can be duplicated for as many realizations desired by the geologist or other user of the subject technology.

Additionally or in the alternative, each data representation 200 may be implemented as a string of property values in a predetermined order or layout. In this regard, the representations may be combined by appending each string of property values representing a respective geological data representation 200 to another string representing another geological data representation 200. Accordingly, any method of combining representations together to form unified geological data representation 302 may be utilized according to the subject technology. In various implementations, unified geological data representation 302 is compatible with the same simulator used to process and simulate each representation 200.

In one or more implementations, the geological data representations 200 may be joined at their respective edges such that the single unified geological data representation 302 is represented as a single, contiguous grid structure. For example, if each representation 200 is represented as a two-dimensional grid of cells, single unified geological data representation 302 may be formed such that it is also represented as a two-dimensional grid of cells. As in the depicted example, geological data representations 200 are represented as two-dimensional arrays that are combined side-by-side into a single two-dimensional cell structure. Likewise, if each representation 200 is represented as a three-dimensional volume of cells, single unified geological data representation 302 may be formed such that it is also represented as a three-dimensional dimensional volume of cells. In various implementations, both the data representations 200 and unified geological data representation 302 may be congruent in structure, shape, and/or property values such that each may be processed by an identical or similar simulation algorithm.

In one or more implementations, each geological data representation 200, or its values therein, may be associated with a realization identifier. The realization identifier may be a unique number or other symbol capable of identifying a set of data. Each realization identifier is representative of a different set of geological data values corresponding to the geological area of interest represented by the representations 200. For example, a stochastic process may generate (e.g., according to some randomized process) a geological data representation 200, including an exemplary set of values for geological properties to represent characteristics of a geological area of interest. Each time the process is performed a new geological data representation 200 may be generated.

The generated geological data representations 200 may be assigned realization identifiers, and the identifiers included in the representations when simulating the geological area of interest. In this regard, unified geological data representation 302 may include multiple realization identifiers, one for each geological data representation 200. The realization identifiers may be extracted during the simulation process so that the simulator may identify and display a simulation for each original geological data representation 200. When simulated, each area of interest in each geological data representation 200 may have a unique name to make it easy to differentiate for reporting purposes. Each geological data representation 200 may be given a number and, when simulated, this number may be added to the name of the geological area of interest in the simulation. For each step in the simulation, a report may be generated by parsing the realization identifier from the simulation data.

Figure 4:
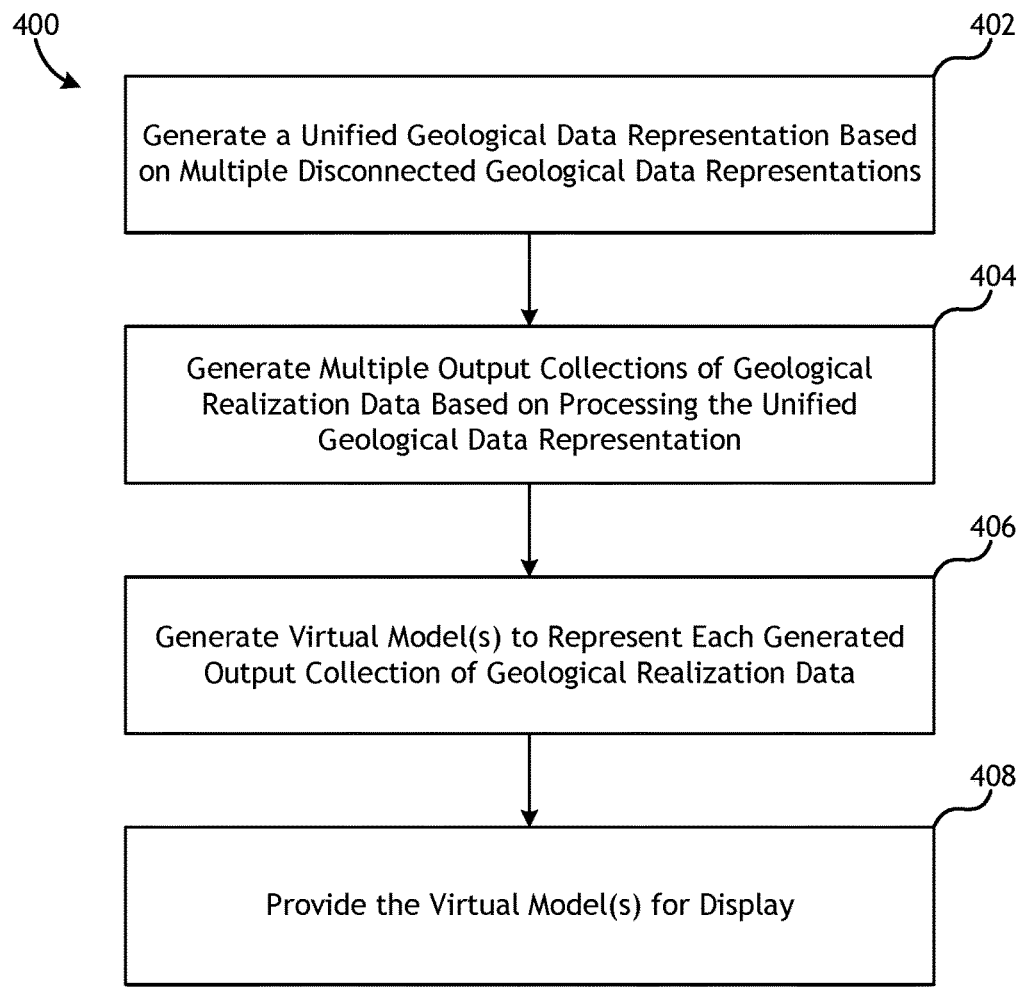
FIG. 4 depicts a flow diagram of an example process for simulating a geological region.

FIG. 4 depicts a flow diagram of an example process 400 for simulating a geological region, according to various aspects of the subject technology. For explanatory purposes, the various blocks of example process 400 are described herein with reference to geological data representation 200 of FIG. 2 and unified data representation 302 of FIG. 3. One or more of the blocks of process 400 may be implemented, for example, by a computing device, including, for example, processing unit(s) 612 of FIG. 6. In some implementations, one or more of the blocks may be implemented apart from other blocks, and by one or more different processors or computing devices. Further for explanatory purposes, the blocks of example process 300 are described as occurring in serial, or linearly. However, multiple blocks of example process 300 may occur in parallel. In addition, the blocks of example process 400 need not be performed in the order shown and/or one or more of the blocks of example process 400 need not be performed.

According to example process 400, a unified geological data representation 302 is generated based on multiple disconnected geological data representations 200 (402). According to one or more implementations, the unified geological data representation 302 may be generated by combining respective grid structures for each disconnected geological data representation 200. Each disconnected geological data representation 200 may include geological property values corresponding to respective cells 204, 206 of one of the respective grid structures. Each respective grid structure may include, for example, a first group of cells and first corresponding property values providing a characterization of a geological area of interest.

The area of interest may be a geological formation capable of producing a fluid resource (e.g., a well or reservoir). Additionally, each respective grid structure may include a second group of cells and second corresponding property values representative of a barrier to a flow of the fluid resource. In various implementations, the second group of cells may surround the first group of cells in each respective grid structure, for example, to provide isolation of fluid flow within the first group of cells during a simulation. As described previously, the property values may be representative of petro-physical properties of earth structure such as porosity or permeability.

The unified geological data representation 302 is processed to generate multiple output collections of geological realization data (404). In one or more implementations, the unified geological data representation is processed by geological simulation software, for example, to generate simulation data to simulate a fluid flow within the area of interest as represented by each geological data representation 200. In one or more implementations, the software of the subject technology may operate as an interface to the simulator so that on generation of the unified geological data representation 302, the generated representation 302 may be automatically sent to the simulator by activation of a control, for example, on the user interface.

The simulator, identifies the second group of cells within the processed data as a flow barrier, and produces simulation data only for the areas of interest isolated by the flow barrier. This identification and production of data may occur for each geological data representation 200. In this regard, the geological property values may be processed for the area of interest as represented by each disconnected geological data representation 200 without influence from property values corresponding to other disconnected geological data representations 200. Accordingly, the simulator may generate a respective output collection of simulation data based on the property values of each geological data representation 200.

In one or more implementations, geological data values associated with each geological data representation are assigned (e.g., before processing) a realization identifier for the geological data representation. Accordingly, the simulator may be configured to identify the realization identifiers when processing the property values provided by the unified geological data representation 302, and associate each identified identifier with the corresponding output collection of geological realization data.

One or more virtual models are generated to represent each generated output collection of geological realization data (406), and provided for display (408). The display of the virtual models may be for example, on a user interface of a computing device.

Many of the above-described features of example process 400 and related features and applications, may be implemented as a software process specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

Figure 5:
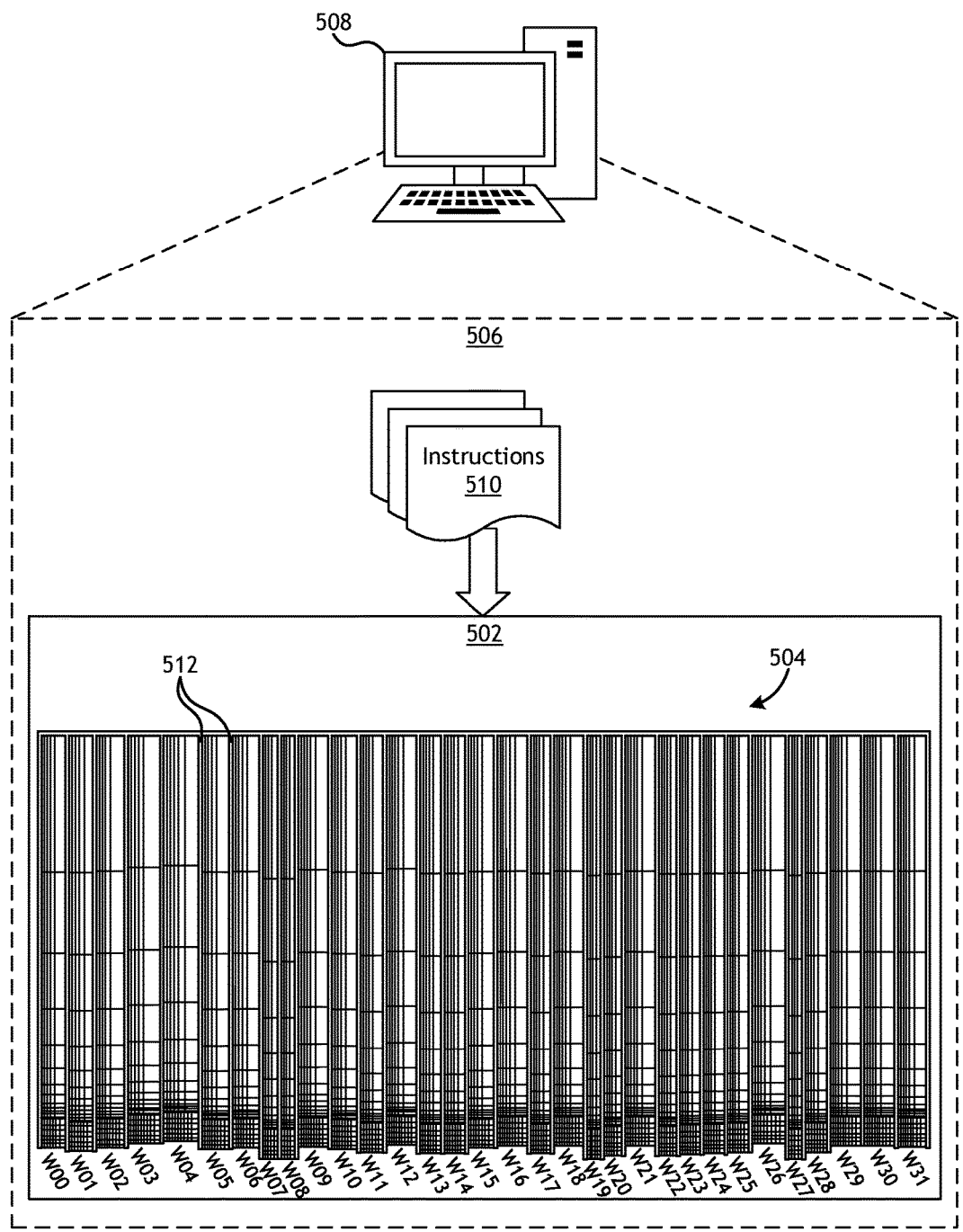
FIG. 5 depicts an example user interface for display of multiple example virtual models in a dynamic runtime environment on a computing device.

FIG. 5 depicts an example user interface 502 for display of multiple example virtual models 504 in a dynamic runtime environment 506 on a computing device 508, according to one or more aspects of the subject technology. During operation of computing device 508, executable instructions 510 are loaded into runtime environment 506 and executed. Executable instructions 510, when executed, create user interface 502, and may perform a number of operations upon data provided for display in user interface 502. Executable instructions 510 may include properties and/or their corresponding property values that may change in response to specific user-initiated navigation paths and/or input associated with user interface 502.

In one or more implementations, after the unified geological data representation 302 is processed and the output collections of geological realization data generated, one or more virtual models corresponding to each collection of geological realization data—and thus each geological data representation 200—may be graphically displayed in user interface 504. As depicted in FIG. 5, a virtual model may include a visual representation of the geological area of interest according to each processed representation 200. In the depicted example, thirty-two wells are graphically presented. Each well is separated in the displayed virtual model according to a respective visual representation 512 of its corresponding cells 204 provided in the corresponding data representation 200.

The geometry as well as the reservoir properties can vary for each processed representation 200 and the effects can be easily viewed graphically. A geologist, reservoir engineer, or other user of the subject technology may review the virtual models and visually compare them to, for example, select the model corresponding to an optimal realization.

Figure 6:
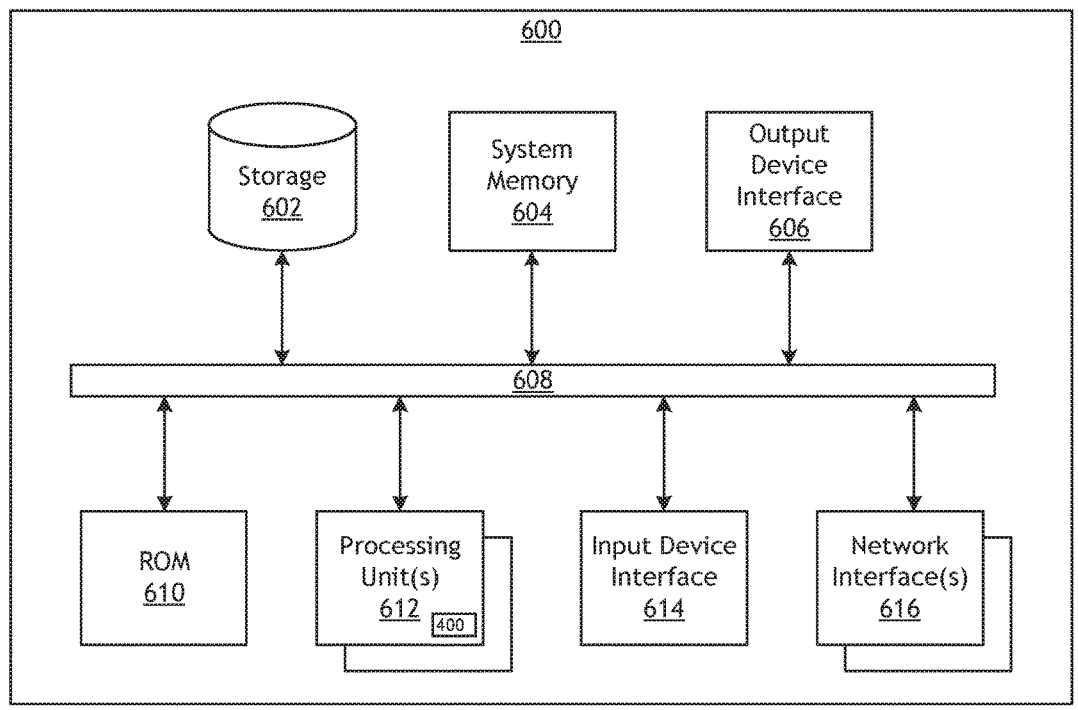
FIG. 6 is a diagram illustrating an example electronic system for use in connection with a process for simulating a geological region.

FIG. 6 is a diagram illustrating an example electronic system for use in connection with a process for simulating a geological region, according to one or more aspects of the subject technology. Electronic system 600 may be a computing device for execution of software associated with one or more portions or steps of process 400. In various implementations, electronic system 600 may be representative of computing device 508, or any other sort of electronic device.

Electronic system 600 may include various types of computer readable media and interfaces for various other types of computer readable media. In the depicted example, electronic system 600 includes a bus 608, processing unit(s) 612, a system memory 604, a read-only memory (ROM) 610, a permanent storage device 602, an input device interface 614, an output device interface 606, and one or more network interfaces 616. In some implementations, electronic system 600 may include or be integrated with other computing devices or circuitry for operation of the various components and processes previously described.

Bus 608 collectively represents all system, peripheral, and chipset buses that communicatively connect the numerous internal devices of electronic system 600. For instance, bus 608 communicatively connects processing unit(s) 612 with ROM 610, system memory 604, and permanent storage device 602.

From these various memory units, processing unit(s) 612 retrieves instructions to execute and data to process in order to execute the processes of the subject disclosure. The processing unit(s) can be a single processor or a multi-core processor in different implementations.

ROM 610 stores static data and instructions that are needed by processing unit(s) 612 and other modules of the electronic system. Permanent storage device 602, on the other hand, is a read-and-write memory device. This device is a non-volatile memory unit that stores instructions and data even when electronic system 600 is off. Some implementations of the subject disclosure use a mass-storage device (such as a magnetic or optical disk and its corresponding disk drive) as permanent storage device 602.

Other implementations use a removable storage device (such as a floppy disk, flash drive, and its corresponding disk drive) as permanent storage device 602. Like permanent storage device 602, system memory 604 is a read-and-write memory device. However, unlike permanent storage device 602, system memory 604 is a volatile read-and-write memory, such a random access memory. System memory 604 stores some of the instructions and data that the processor needs at runtime. In some implementations, the processes of the subject disclosure are stored in system memory 604, permanent storage device 602, and/or ROM 610. From these various memory units, processing unit(s) 612 retrieves instructions to execute and data to process in order to execute the processes of some implementations.

Bus 608 also connects to input and output device interfaces 614 and 606. Input device interface 614 enables the user to communicate information and select commands to the electronic system. Input devices used with input device interface 614 include, for example, alphanumeric keyboards and pointing devices (also called "cursor control devices"). Output device interfaces 606 enables, for example, the display of images generated by the electronic system 600. Output devices used with output device interface 606 include, for example, printers and display devices, such as cathode ray tubes (CRT) or liquid crystal displays (LCD). Some implementations include devices such as a touch-screen that functions as both input and output devices.

Finally, as shown in FIG. 6, bus 608 also couples electronic system 600 to a network (not shown) through network interfaces 616. Network interfaces 616 may include, for example, a wireless access point (e.g., Bluetooth or WiFi). Network interfaces 616 may also include hardware (e.g., Ethernet hardware) for connecting the computer to a part of a network of computers such as a local area network ("LAN"), a wide area network ("WAN"), or an Intranet, or a network of networks, such as the Internet. Any or all components of electronic system 600 can be used in conjunction with the subject disclosure.

These functions described above can be implemented in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

To facilitate a better understanding of the present disclosure, the following examples of preferred or representative embodiments are given. In no way should the following examples be read to limit, or to define, the scope of the disclosure Embodiments disclosed herein include:

A. A method for selecting geological data realizations, comprising receiving a unified geological data representation based on multiple disconnected geological data representations, generating, by the one or more computing devices, multiple output collections of geological realization data based on the unified geological data representation, each output collection corresponding to a respective one of the disconnected geological data representations, generating, by the one or more computing devices, one or more respective virtual models for representation of the generated output collections of geological realization data, and providing, by the one or more computing devices, the respective virtual models for display. Other aspects include corresponding systems, apparatuses, and computer program products for implementation of the computer-implemented method.

B. A system, comprising one or more processors and a memory. The memory includes instructions that, when executed by the one or more processors, cause the one or more processors to facilitate the steps of receiving a unified geological data representation based on multiple disconnected geological data representations, generating, by the one or more computing devices, multiple output collections of geological realization data based on the unified geological data representation, each output collection corresponding to a respective one of the disconnected geological data representations, generating, by the one or more computing devices, one or more respective virtual models for representation of the generated output collections of geological realization data, and providing, by the one or more computing devices, the respective virtual models for display. Other aspects include corresponding systems, apparatuses, and computer program products for implementation of the computer-implemented method. Other aspects include corresponding methods, apparatuses, and computer program products for implementation of the computer-implemented method.

C. A computer program product tangibly embodied in a computer-readable storage device and comprising instructions that, when executed by a computing device, cause the computing device to receive a unified geological data representation based on multiple disconnected geological data representations, the unified geological data representation being generated based on combining respective grid structures for each disconnected geological data representation, process the unified geological data representation to generate multiple output collections of geological realization data, each output collection corresponding to a respective one of the disconnected geological data representations, generate one or more respective virtual models for representation of the generated output collections of geological realization data, and provide the respective virtual models for display. Other aspects include corresponding methods, apparatuses, and systems for implementation of the computer-implemented computer program product.

Each of embodiments A, B, and C may have one or more of the following additional elements in any combination:

Element 1: wherein processing the unified geological data representation comprises processing geological property values for an area of interest represented by each disconnected geological data representation without influence from property values corresponding to other disconnected geological data representations. Element 2: wherein the unified geological data representation is generated by combining respective grid structures for each disconnected geological data representation. Element 3: wherein each disconnected geological data representation comprises geological property values corresponding to respective cells of one of the respective grid structures. Element 4: wherein each respective grid structure includes a first group of cells and first corresponding property values providing a characterization of a geological area of interest. Element 5: wherein the area of interest is a geological formation capable of producing a fluid resource, and wherein each respective grid structure includes a second group of cells and second corresponding property values representative of a barrier to a flow of the fluid resource. Element 6: wherein the second group of cells surrounds the first group of cells in each respective grid structure. Element 7: wherein the first and second groups of cells and corresponding first and second corresponding property values comprise values representative of a porosity or a permeability of earth structure. Element 8: wherein geological data values associated with each geological data representation are assigned a realization identifier for the geological data representation, and wherein each output collection of geological realization data is associated with a respective assigned realization identifier.

Therefore, the disclosed systems and methods are well adapted to attain the ends and advantages mentioned as well as those that are inherent therein. The particular embodiments disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces. If there is any conflict in the usages of a word or term in this specification and one or more patent or other documents that may be incorporated herein by reference, the definitions that are consistent with this specification should be adopted.

As used herein, the phrase "at least one of" preceding a series of items, with the terms "and" or "or" to separate any of the items, modifies the list as a whole, rather than each member of the list (i.e., each item). The phrase "at least one of" allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the claims.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "example" is used herein to mean "serving as an example or illustration." Any aspect or design described herein as "example" is not necessarily to be construed as preferred or advantageous over other aspects or designs.

What is claimed is:

1. A computer-implemented method of simulating fluid flow within a geological region, comprising:
generating, by one or more computing devices, a unified geological data representation based on different disconnected geological data representations corresponding to grid cells in a geological model of a geological area of interest, each disconnected geological data representation including a different set of geological property values for a different realization of the same grid cells representing a same portion of the geological area of interest;
generating, by the one or more computing devices, multiple output collections of geological realization data based on the unified geological data representation, each output collection corresponding to a respective one of the disconnected geological data representations;
generating, by the one or more computing devices, one or more respective virtual models representing the generated output collections of geological realization data; and
simulating, by the one or more computing devices, fluid flow within the geological area of interest, based on the one or more virtual models.

2. The method of claim 1, wherein generating the unified geological data representation further comprises:
processing geological property values for an area of interest represented by each disconnected geological data representation without influence from property values corresponding to other disconnected geological data representations.

3. The method of claim 1, wherein the unified geological data representation is generated by combining respective grid structures for each disconnected geological data representation.

4. The method of claim 3, wherein each disconnected geological data representation comprises geological property values corresponding to respective cells of one of the respective grid structures.

5. The method of claim 4, wherein each respective grid structure includes a first group of cells and first corresponding property values providing a characterization of the geological area of interest.

6. The method of claim 5, wherein the area of interest is a geological formation capable of producing a fluid resource, and wherein each respective grid structure includes a second group of cells and second corresponding property values representative of a barrier to a flow of the fluid resource.

7. The method of claim 6, wherein the second group of cells surrounds the first group of cells in each respective grid structure.

8. The method of claim 6, wherein the first and second groups of cells and corresponding first and second corresponding property values comprise values representative of a porosity or a permeability of earth structure.

9. The method of claim 1, wherein geological data values associated with each geological data representation are assigned a realization identifier for the geological data representation, and wherein each output collection of geological realization data is associated with a respective assigned realization identifier.

10. A system, comprising:
one or more processors; and
a memory including instructions that, when executed by the one or more processors, cause the one or more processors to perform operations comprising:
generating a unified geological data representation based on different disconnected geological data representations corresponding to grid cells in a geological model of a geological area of interest, each disconnected geological data representation including a different set of geological property values for a different realization of the same grid cells representing a same portion of the geological area of interest;
processing the unified geological data representation to generate multiple output collections of geological realization data, each output collection corresponding to a respective one of the disconnected geological data representations;

generating one or more respective virtual models representing the generated output collections of geological realization data; and simulating fluid flow within the geological area of interest, based on the one or more virtual models.

11. The system of claim 10, wherein generating the unified geological data representation further comprises:

processing geological property values for an area of interest represented by each disconnected geological data representation without influence from property values corresponding to other disconnected geological data representations.

12. The system of claim 10, wherein the unified geological data representation is generated by combining respective grid structures for each disconnected geological data representation.

13. The system of claim 12, wherein each disconnected geological data representation comprises geological property values corresponding to respective cells of one of the respective grid structures.

14. The system of claim 13, wherein each respective grid structure includes a first group of cells and first corresponding property values providing a characterization of the geological area of interest.

15. The system of claim 14, wherein the area of interest is a geological formation capable of producing a fluid resource, and wherein each respective grid structure includes a second group of cells and second corresponding property values representative of a barrier to a flow of the fluid resource, wherein the second group of cells surrounds the first group of cells in each respective grid structure, and wherein the first and second groups of cells and corresponding first and second corresponding property values comprise values representative of a porosity or a permeability of earth structure.

16. The system of claim 10, wherein geological data values associated with each geological data representation are assigned a realization identifier for the geological data representation, and wherein each output collection of geological realization data is associated with a respective assigned realization identifier.

17. A non-transitory computer-readable storage medium storing instructions thereon that, when executed by a computing device, cause the computing device to perform a plurality of operations, including operations to:

generate a unified geological data representation of a geological area of interest based on different disconnected geological data representations corresponding to grid cells in a geological model of the geological area of interest, each disconnected geological data representation including a different set of geological property values for a different realization of the same grid cells representing a same portion of the geological area of interest;

process the unified geological data representation to generate multiple output collections of geological realization data, each output collection corresponding to a respective one of the disconnected geological data representations;

generate one or more respective virtual models representing the generated output collections of geological realization data; and simulate fluid flow within the geological area of interest, based on the one or more virtual models.

18. The non-transitory computer-readable storage medium of claim 17, wherein each respective grid structure includes a first group of cells and first corresponding property values providing a characterization of a geological formation capable of producing a fluid resource, and wherein each respective grid structure includes a second group of cells and second corresponding property values representative of a barrier to a flow of the fluid resource.

19. The method of claim 1, wherein the simulating comprises:

providing the one or more virtual models to a simulator to simulate fluid flow within the geological area of interest as represented by each disconnected geological data representation to facilitate production of fluids from the geological area of interest.

20. The non-transitory computer-readable storage medium of claim 17, wherein the operations performed by the computing device further comprise operations to:

combine respective grid structures for each disconnected geological data representation to generate the unified geological data representation of the geological area of interest.

* * * * *